United States Patent [19]

Salihi et al.

[11] Patent Number: 4,484,127
[45] Date of Patent: Nov. 20, 1984

[54] INVERTER POWER TRANSISTOR PROTECTION

[75] Inventors: Jalal T. Salihi, Manchester; Leca Boiucaner, Farmington, both of Conn.

[73] Assignee: Otis Elevator Company, Farmington, Conn.

[21] Appl. No.: 383,053

[22] Filed: May 28, 1982

[51] Int. Cl.$^3$ .................................... H02H 7/122
[52] U.S. Cl. .................... 318/802; 318/811; 363/56
[58] Field of Search ............ 363/56, 98, 41; 318/801–803, 806, 811, 767; 361/101; 330/207 P

[56] References Cited

U.S. PATENT DOCUMENTS

| | | | |
|---|---|---|---|
| 4,228,493 | 10/1980 | Sarte et al. | 363/56 |
| 4,270,164 | 5/1981 | Wyman et al. | 363/56 |
| 4,371,824 | 2/1983 | Gritter | 363/56 |
| 4,427,902 | 1/1984 | Hickman et al. | 363/56 |

FOREIGN PATENT DOCUMENTS

| | | | |
|---|---|---|---|
| 97752 | 8/1979 | Japan | 363/56 |
| 148221 | 11/1979 | Japan | 363/56 |

*Primary Examiner*—William H. Beha, Jr.
*Attorney, Agent, or Firm*—Robert E. Greenstien

[57] ABSTRACT

An elevator system is powered by a multiphased motor to which power is supplied from an inverter, which is powered by a battery. The collector-emitter voltage across the output transistors in the inverter is sensed as the transistors are turned on, and if the voltage does not drop to the saturation voltage within a certain time, the drive to the inverter is discontinued. If at any time while the transistors are in saturation saturation voltage rises, the drive is turned off. To start the drive, the transistors are permitted to turn on for a short interval of time. If, following that interval of time, the saturation voltage is not correct, the drive is turned off. The inverter has separate sections for driving each winding of the motor, and each of these sections has a separate power supply and fault detection circuit, which operates to measure the saturation voltage across the transistor and provide a fault signal which indicates that the drive should be terminated.

9 Claims, 5 Drawing Figures

INVERTER POWER TRANSISTOR PROTECTION

DESCRIPTION

1. Technical Field

This invention pertains to the protection of power transistors that are found in the output portion of an inverter. It is particularly concerned with inverters that are used in high powered applications, namely, for powering an AC motor in an elevator system.

2. Background Art

Inverters, which are well known, can be used to generate alternating power from a DC source, such as a battery, to power an alternating current motor. But, being a semiconductor device, an inverter has an obvious limitation: the current handling capability of its output circuit. For that reason, while inverters have been used extensively for providing power to the alternating current motors, they have not been used in high speed elevator systems—because in that application the motor currents are extremely high (for example, during starting and stopping conditions), but power transistors that have been available have been incapable of handling these current requirements for an elevator application, where the currents can be extremely high at certain times.

But, advances in transistor technology now make it possible to construct an inverter that has output stages which can handle the currents required for a high speed elevator system, and that makes the use of an inverter in a high speed elevator system attractive, and, especially for one particular application: to use the inverter for a variable frequency AC drive.

In simple terms, a variable frequency drive provides signals that control the operation of the inverter so that it produces an output whose frequency and magnitude are varied to control the motor operation to maintain a particular speed, torque and slip relationship. This type of motor control can be used with single phase and multiphase electric motors. It is by no means easy to construct, but one device of that type is the subject of companion co-owned U.S. patent application Ser. No. 373,063, titled ELEVATOR POLYPHASE MOTOR CONTROL, by Salihi and Duckworth on Apr. 29, 1982.

But, as one might expect, the power transistors that are now available to make it possible to use an inverter in a high speed elevator system are expensive, so much so that it is unattractive to consider replacing them, if they fail during operation, for one reason or another. The power transistors, hence, should not be subjected to damaging power dissipation, such as operation when the collector voltage is above the saturation voltage. A compelling factor is that even failure of just one transistor in the inverter output can cascade into failure of many to produce, in short, an expensive repair.

DISCLOSURE OF INVENTION

According to the present invention, the inverter is powered by a pulse width modulator which receives signals that control its output to produce pulses that drive the inverter output stages to produce a sinusoidal inverter output signal that powers an AC motor. To do that, the pulse width modulator produces a base drive signal which drives a corresponding power transistor in the inverter, and when that base drive signal is produced, the voltage across the collector and emitter of the output transistor is independently sensed over a fixed duration of time. If the voltage is not decreased to the transistor saturation voltage within that period of time, that condition represents fault—a problem with the output transistor. In response, a signal is generated, which is supplied to the elevator motion control, and which deactivates the pulse width modulator, discontinuing the generation of the drive signal, which, in turn, deactivates the inverter, a result that no longer produces an output signal to the motor. The motion controller uses that fault signal to initiate safety stopping sequences in the elevator, for example, to apply the brake to bring the car to a smooth stop.

Also according to the present invention, once the transistor is in saturation, the voltage between the collector and emitter is continually sensed, and if that voltage begins to rise above the transistor saturation level, the fault signal is generated.

Also according to the invention, when the motor is stopped, no power is being supplied to it, and the motion control calls for operation of the motor, a test sequence is initiated. When the motor control calls for motor operation, the pulse width modulator is independently activated for a short interval of time. But, if following that short interval of time a fault is detected, the fault signal is again provided—deactivating the pulse width modulator. The inverter, as a result, is not really turned on. In other words, if just at that moment—when the motor operation is called for—a fault is detected, the inverter is shut down. This sequence prevents any damage to the inverter that might occur during motor startup, due to the very short operation time while attempting a start. Moreover, it prevents the car from leaving the floor if there is a problem.

BEST MODE FOR CARRYING OUT THE INVENTION

Figure 1:
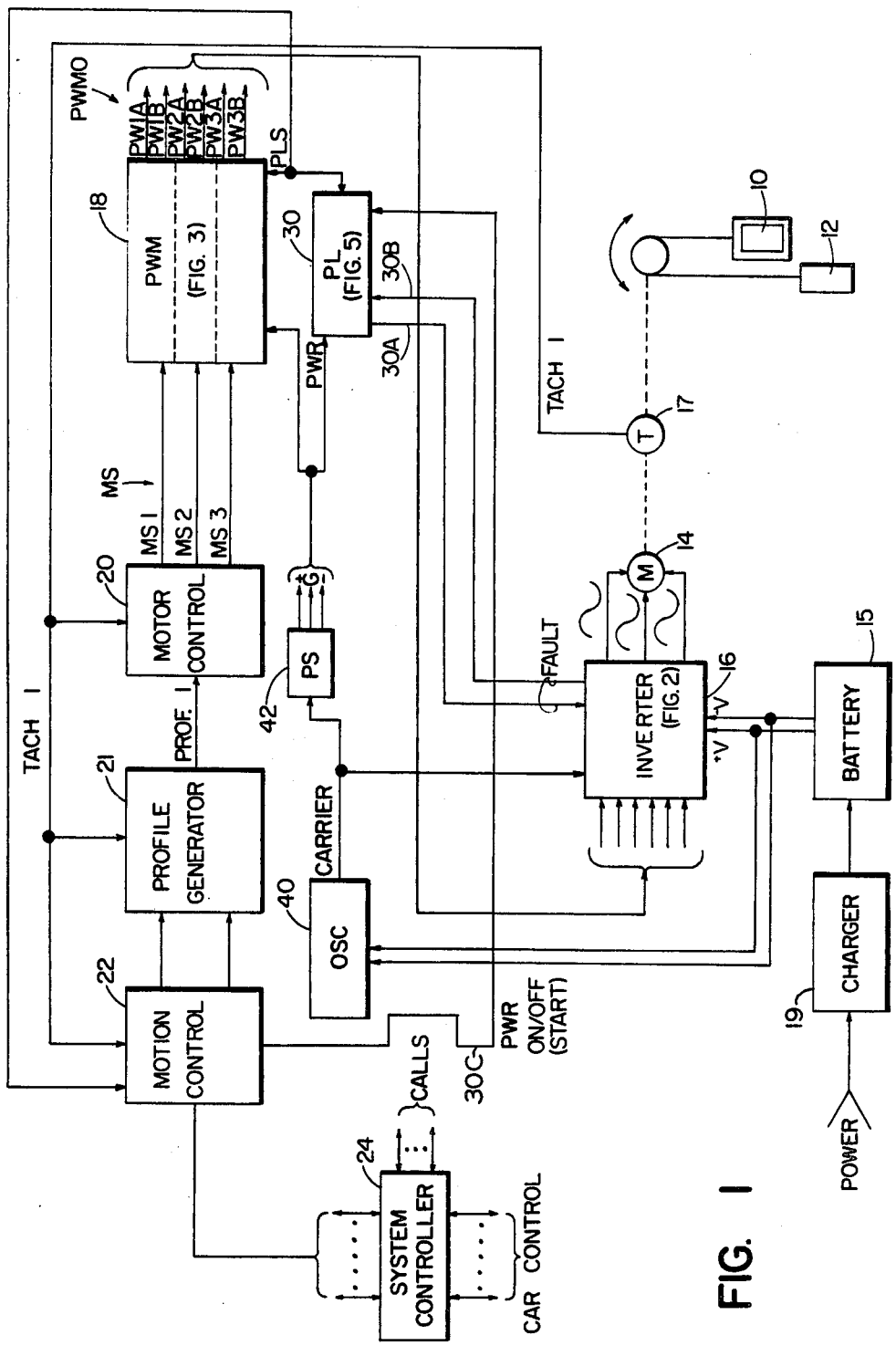
FIG. 1 is a block diagram of an elevator motion system in which a motor is powered by an inverter which receives power from a battery, and the operation of the inverter is controlled by a pulse width modulator whose operation is controlled according to the present invention.

FIG. 1 shows an elevator system, one application for the present invention. In this system an elevator car 10, to which a counterweight 12 is connected, is propelled by a motor 14. A tachometer 17 senses the motor operation and provides a signal, TACH 1 signal, which indicates the speed and direction of the motor.

The motor 14 is powered by an inverter 16 which receives its power, +V, −V from a battery 15, actually a collection of batteries that produce a high voltage, typically about 200 volts, the voltage needed to provide sufficient power to the motor. The motor 14 here is of the 3-phase type induction motor, receiving that 3-phase voltage from the inverter. (Of course, single phase can be used.) The inverter is controlled to control the frequency and magnitude of that voltage, and the mentioned patent application filed by Salihi et al discloses one type of variable frequency drive for that purpose.

The inverter 16 receives output signals from a pulse width modulator (PWM) 18. Those output signals control the output from the inverter to the motor, e.g. to produce that variable frequency output. The output from the pulse width modulator actually comprises three phase signal pairs, Phase 1a, 1b, Phase 2a, 2b, Phase 3a,3b, each pair driving the inverter to provide the voltage (or current) to power the motor 14. Each of those pairs actually controls two transistors in the base drive in a push/pull transistor configuration to provide the voltage and current to a motor winding W1, W2, W3 (See FIG. 2). The pulse width modulator 18 is controlled by a motor control 20, which produces a motor control signal, MS signal, for controlling each of the phase signal pairs. This motor control 20 controls the operation of the pulse width modulator so as to produce the desired speed and torque characteristics for the motor to obtain desired elevator performance characteristics. The motor control 20 is controlled by the output signal, PROF 1, from a profile generator 21, a device that is well known in the elevator art for controlling the performance characteristics of the motor in order to achieve desired acceleration and deceleration characteristics. The profile generator 21, in turn, receives a plurality of signals from a motion control unit 22, also well known in the art, for controlling the operation of the motor in response to system requirements that are manifested to the motion controller 22 from the overall system controller 24, which also is well known in the art. The system controller 24 receives those requirements, car calls and hall calls (e.g. from buttons), and generates control signals that are sent to the motion controller to operate the profile generator to achieve desired car performance to meet those requirments.

The TACH 1 signal from the tachometer 17 is supplied to the motion controller, profile generator and motor control to provide motor feedback control capability—closed loop motor control.

According to the present invention, the operation of the inverter is sensed by a protection logic (PL) circuit 30. The protection logic circuit is connected to the inverter 16 in a special way: Power flows from the protection logic 30 over a line 30A into the inverter, and there it passes in series through the fault detectors (FD), and then back to the protection logic 30B. If any one of the fault detectors (There is one for each transistor T.) indicates that a fault is in its transistor, that series connection is broken. This results in removal of a protection logic signal, PLS signal, which is supplied to the pulse width modulator, and which powers the pulse width modulator. So, when it is removed, power to the pulse width modulator is turned off, and, so, drive from the pulse width modulator is turned off and the drive from the pulse width modulator to the inverter is removed. This obviously turns off the drive to the inverter, preventing further operation (in most cases, clearing the fault). The PLS signal is also provided to the motion control circuit, but this is done to enable the motion control to control car operation accordingly. For example, if a fault occurs just at the time that the car is about to move, the doors will be allowed to open—for passengers to leave the disabled car—and, of course, the car will not be moved. Or, if the fault occurs while the car is ascending or descending, an emergency stop, braking operation and slowdown, will be initiated.

The voltages (+V, −V) on the inverter transistors (across the CE junction) are high (from the battery), and so the base drive circuit (e.g. 16b) and FD circuit are separately powered through an isolated power supply. This power supply includes an oscillator 40 powered by the battery, which provides a carrier signal that is supplied to a power supply 42, which consists of a transformer 43 and bridge rectifier 45 for applying FD and base drive power. The output from this power supply is supplied to the control circuitry 18, 20, 21, 22, 30, while the inverter itself is powered from the battery 18. (The battery is also charged from a charger 19, and, as taught in the companion application to Salihi et al, the inverter provides regeneration of power back into the battery under certain car motion conditions. Use of the oscillator isolates the PWM, PL and inverter from the other system components, e.g. motor control 20.)

Figure 2:
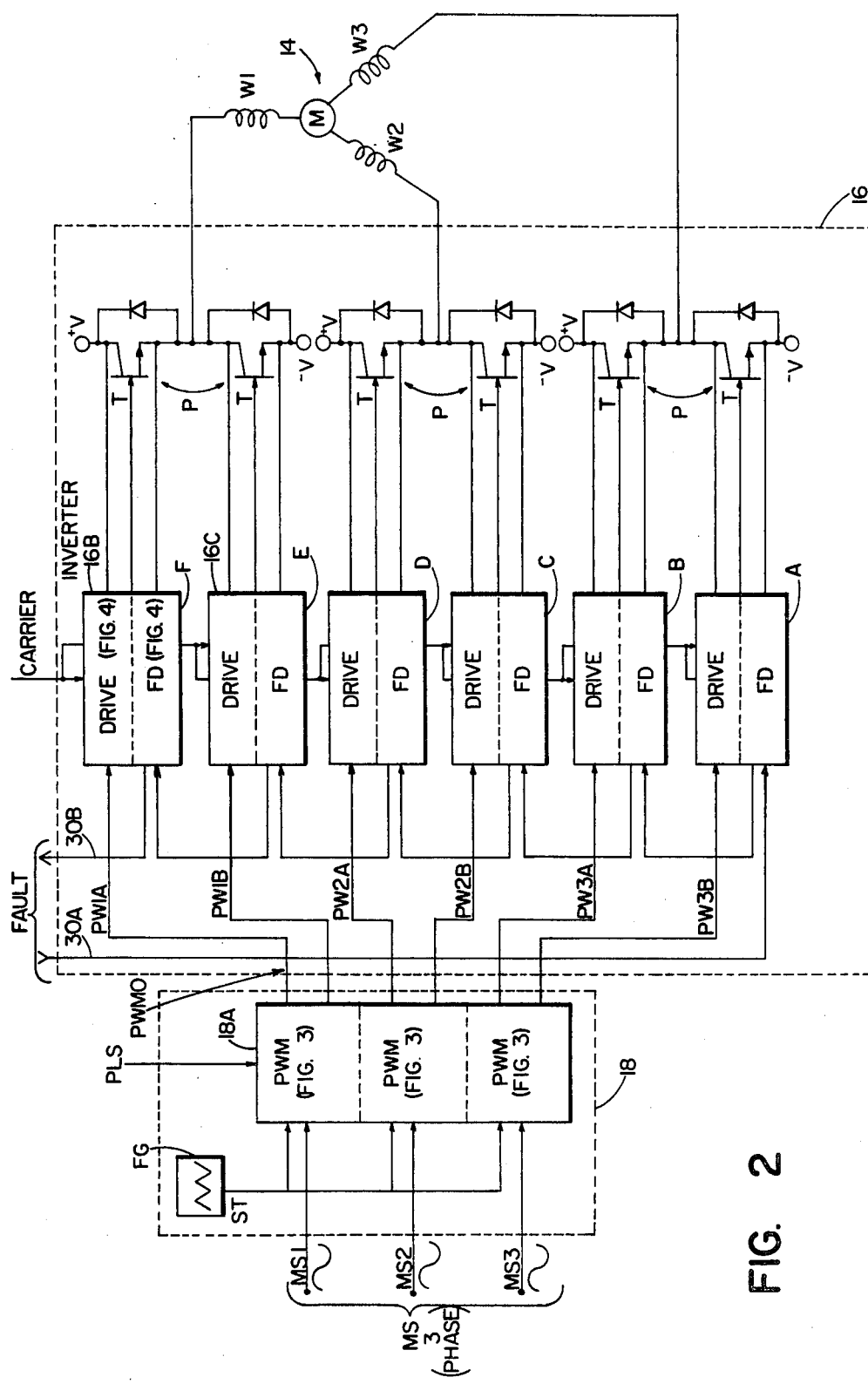
FIG. 2 is a block diagram of the inverter.
Figure 3:
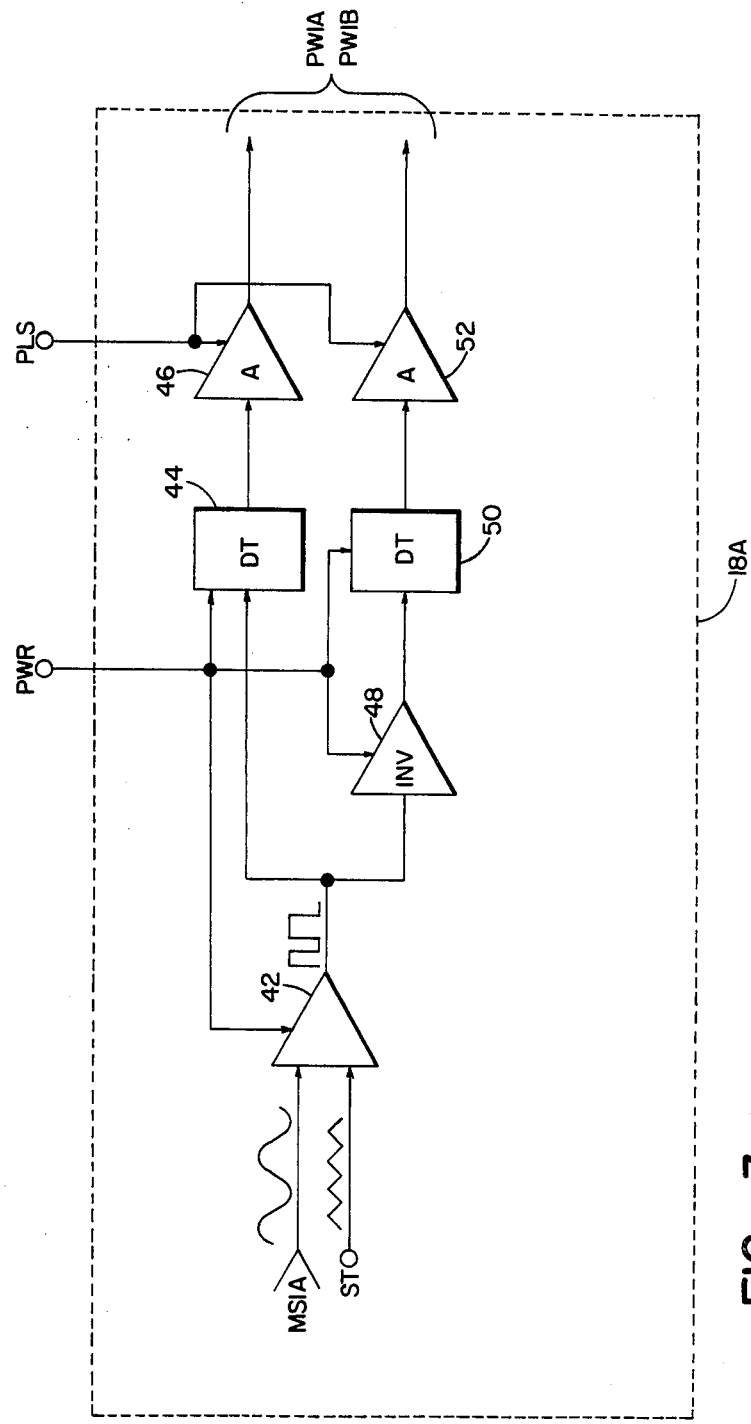
FIG. 3 is a block diagram of a portion of the pulse width modulator; for controlling inverter drive for one motor winding.

The pulse width modulator, shown in FIG. 2, and in detail in FIG. 3, actually includes three "channels", each actually a separate pulse width modulator. The output from each channel includes two signals, each of which goes to the base of a separate transistor (T) drive in the inverter. Associated with that separate drive is the companion fault detection (FD) unit (i.e. units), whose isolated output (opto-isolator) receives current from the PL circuit over the line 30A. Thus, current flows through the line 3a to the FD unit A and FD units B, C, D, E, and F, finally exiting from FD unit F to return over line 30B to the PL circuit. The FD unit functions to interupt that current flow if there is a fault detected with its companion transistor T. Each transistor T is driven by a corresponding drive (shown in FIG. 4 in detail). Thus, each section of the pulse width modulator 18, that is, each one of the individual PWM units 18A, produces a pair of signals (e.g. PW1A, PW1B), each going to one drive (e.g. 16A, 16B). That signal is a pulse whose duration is proportional to the value of the sinusoidal input signal (duration=F(Sine ω(t)), to switch transistor T on and off so that its average output varies sinusoidally. The motor windings W1, W2 and W3 are each tapped off between the collector and emitter of transistor pair P. The drive from each PWM produces a push/pull action between +V and −V supplies, and the resultant current in the transistor is sinusoidal.

Referring to FIG. 3, it shows one of the PWM units, the one shown being for producing the PW1A and PW1B signals. The MS signal is supplied to one input of a comparator 42. The other input receives a triangular signal, ST signal, from a function generator (FG). The resultant output, on line 42a, from the comparator 42 is a train of pulses, the duration of which is varied in proportion to the amplitude of the MS signal, a sine wave (at Sine ω(t)). Those output pulses from the comparator 42 are supplied via the dead time (DT) 44 to an amplifier 46 to produce one PW1A signal, which is a train of pulses. The output from amplifier 42 is also supplied to an inverter circuit 48, to another circuit 50, which provides its output, also pulses whose magnitude vary in time as a function of the MS signal, to another amplifier 52. The output of the amplifier 52, basically the inverse of the output from the amplifier 46, is the PW1B signal. The purpose of dead time circuits is to avoid coincident conduction of the two transistors in pair P. This basically describes a well known pulse width modulator circuit for producing a pair of inverse pulse width modulated signals. Each one of those signals is supplied to one of the drives, and the two of them (e.g. PW1A or PW1B) comprise the driving pair that drives the transistor pair P in the push/pull manner.

It is important to observe, in the illustration in FIG. 3 of the pulse width modulator, that powder to the amplifier 42 and the DT circuits 44 and 50 and the inverter 48 are derived from a fixed power supply, power supply 42 (e.g. a DC supply). However, power to the output buffer amplifiers 46 and 52 is the PLS signal, which is supplied from the protection logic circuit 30. As stated previously, in the event there is a fault, that PLS signal is terminated, and, as a consequence, the buffer amplifiers 46 and 52 are turned off (made inoperational), which discontinues the output signals that drive the transistor pairs, thus turning the drive off. This is one form of protection in a system according to the present invention. The next portion describes generation of the FAULT signal, which causes the PLS signal to be stopped.

Figure 4:
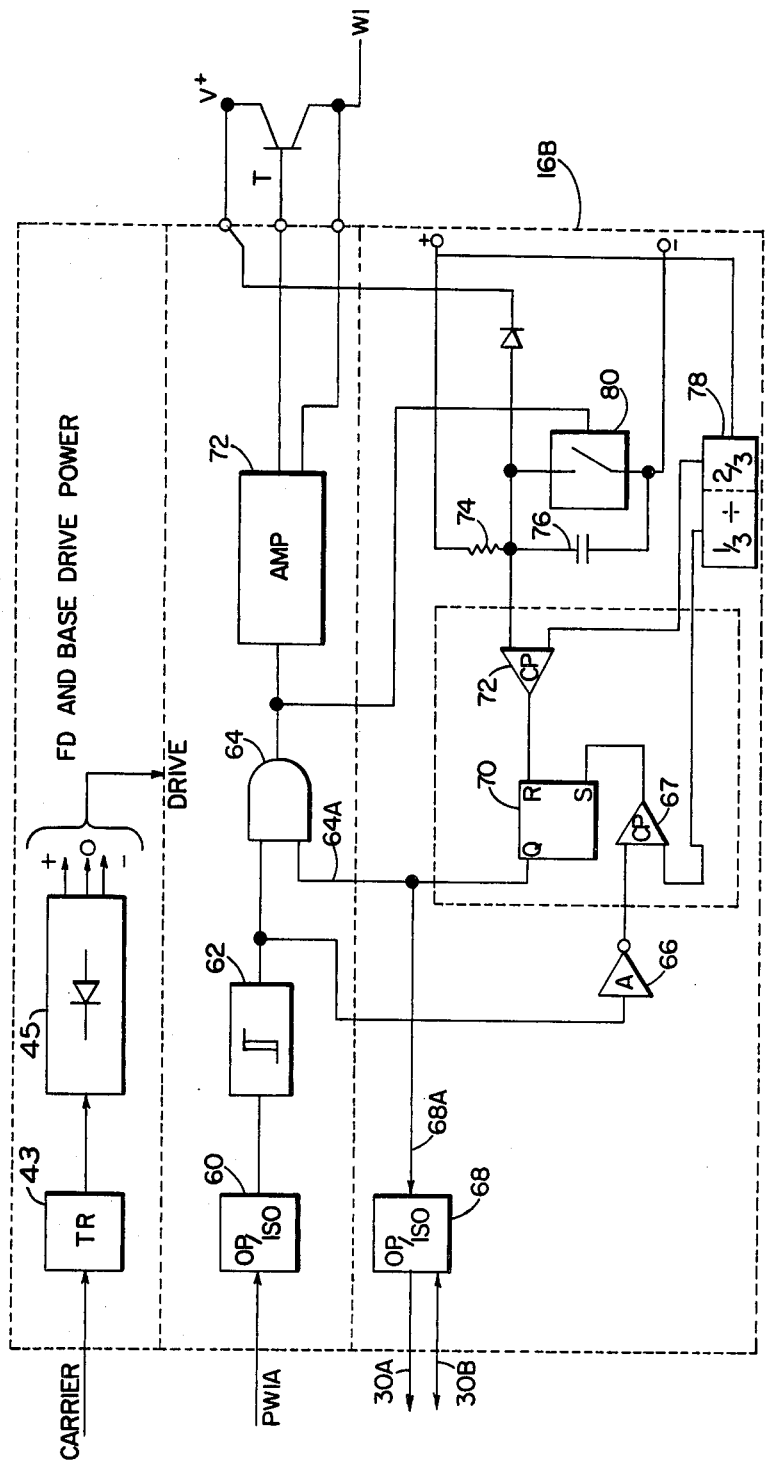
FIG. 4 is a block diagram of one base drive and its corresponding power supply and fault detector, which are located in the inverter.

Referring to FIG. 4, it shows one of the drives for driving one of the transistors and its corresponding fault detector. The drive signal, in this case PW1A, is provided to an optical isolator 60, whose output drives a Schmitt trigger, which shapes the waveform output from the isolator. The output from the Schmitt trigger is provided to one input of a gate 64 and also to inverting amplifier 66. The FAULT signals, on lines 30A and 30B, pass through a circuit 68 that represents the transistor of an isolator (well known) that is driven to allow current to flow through the transistor 68 between lines 30A and 30B, depending on the status of the input signal on the line 68A. That input signal on the line 68A is connected to the output of a flip-flop 70, which is also connected to the other input on the gate 64. The output from gate 64 is supplied to a driving amplifier 72, which provides the necessary base drive to produce current flow through the transistor T. The output from that amplifier depends, of course, on the output from the gate 64, and that output is a function of the signal level on the line 64A. If the line 64A is high, the signal from the shaper 62 is passed through the gate 64 and through the buffer amplifier 72 to drive the transistor T as a function of the PW1A signal. On the other hand, if the signal level on the line 64A is low, the gate 64 is turned off and no signal passes through to turn the transistor on and off, and, consequently, power to the winding W1 is not furnished. Likewise, if the signal on line 64A is low, the optical isolator turns off the transistor that is contained in the circuit 68 and current flow through the lines 30A and 30B is terminated, indicating the presence of a fault. The signal on that line 64A is a function of the operation of the flip-flop 70. Its reset input is connected to a comparator 72, and one input on this comparator 72 is connected to the junction of a resistor 74 and a capacitor 76. The other input is connected to a divider circuit, which is connected to the positive voltage supply. A switch 80 is also included in this fault detection circuit, and it controls the voltage across the capacitor 76. The state of that switch 80 is a function of the output from the gate 64: When the PWO signal is first supplied to the isolator 60, the resultant output on the gate 64 opens the switch. The output from the shaper 62, likewise, is passed through the two amplifiers 66 and 67, and is then applied to the set terminal on the flip-flop. As a result, the flip-flop output goes high, which allows signal transfer of the PW1A signal through the gate 64 to continue. As a result, voltage across the transistor T begins to drop as the transistor begins to conduct. At the same time, the capacitor 76 begins to charge through resistor 74. Meanwhile, the voltage at that junction point between the resistor and the capacitor thus rises as a function of the PC time constant. The voltage across the transistor actually drops fast until the transistor is fully ON: That voltage, between the collector and emitter, may progressively decrease from 200 volts to about 2 volts, which is lower than the reference voltage (e.g. 5 volts) set by the divider 78 on the comparator 72. But, at the same time that the transistor is turning on, the capacitor 76 is charging up, and, as long as the capacitor voltage remains lower than the voltage from the divider, which means that the transistor behaves in a desired way, the state of the comparator 72 does not shift, and so the flip-flop 70 stage does not change. The output signal through the gate 64 therefore continues to be transmitted to the amplifier 72. But, on the other hand, if the capacitor voltage should exceed the voltage from the divider, that would indicate that the transistor has not turned on quickly enough (in the required amount of time as reflected by the charging time of the capacitor 76) and, hence, the comparator would change state. The flip-flop is then reset, and this changes the state on the line 64A, turning the gate 64 off, and turning off the drive to the transistor T. The switch 80 is also activated at that point, discharging the capacitor 76. That change in state on the line 64 represents a fault: The transistor did not turn on in the required period of time. That condition is transmitted back to the protection logic by the discontinuance of current flow in the lines 30A and 30B.

The fault detection circuit also responds to the presence of the PW1A signal. The output from the wave shaper 62 is transmitted via the amplifier to the comparator 67, which sets the flip-flop 70, if the output from the wave shaper 62 indicates an "on" command.

Another test occurs during normal drive. Assuming that the drive is operating properly and that no fault has been detected during this "turn-on sequence" (while the capacitor is charging), the capacitor will charge up to the collector voltage and stay there (that voltage will be typically about 4 volts). If, while the transistor is on, the collector voltage begins to rise, the input on the comparator 72 will rise, and when the voltage across the capacitor is exceeded, the comparator 72 will change state and reset the flip-flop 70, which will discontinue the base drive, and discontinue the current flow through lines 30A and 30B.

Figure 5:
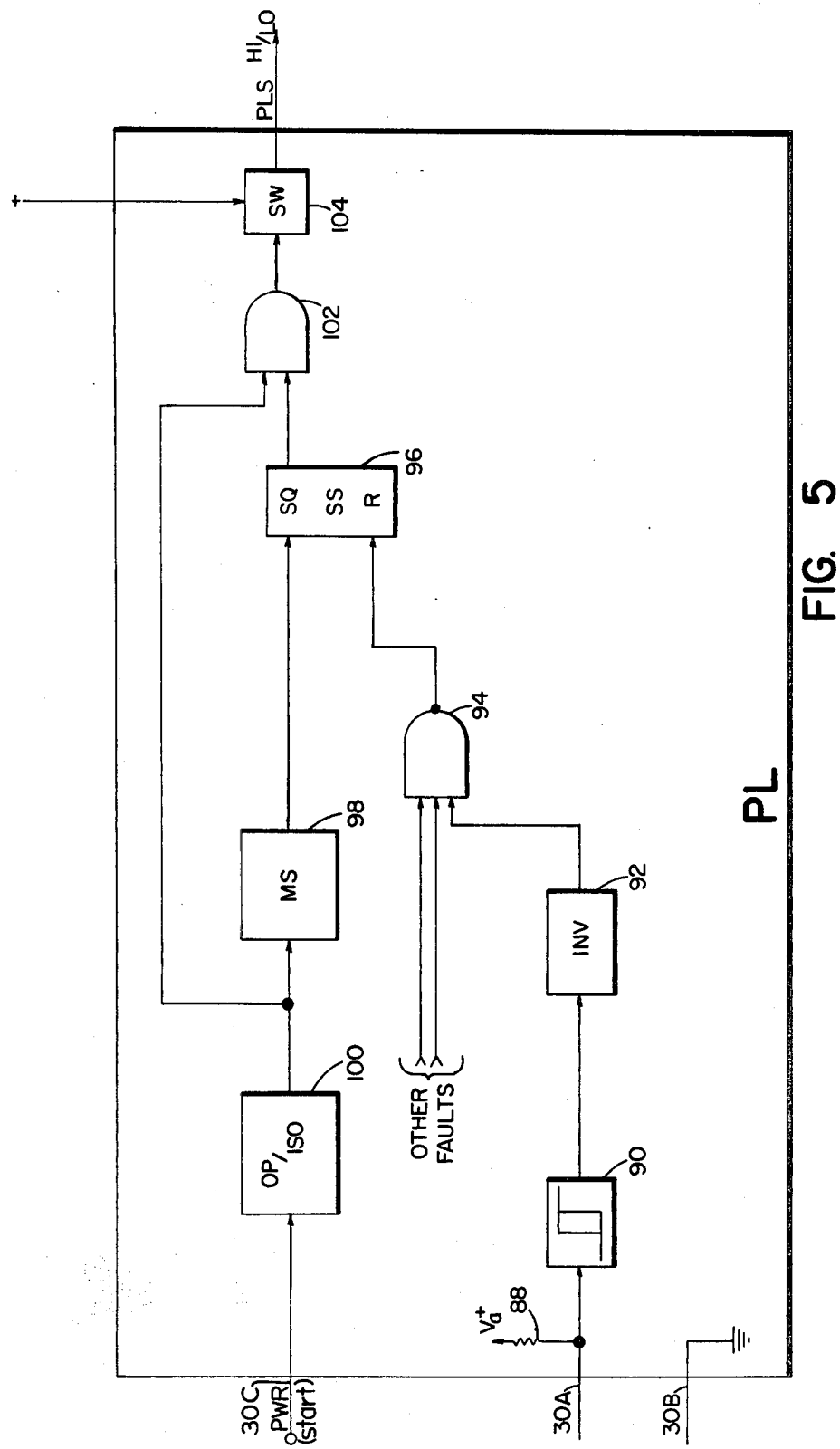
FIG. 5 is a block diagram of a protection logic circuit that is used in the system in FIG. 1 for sensing a fault in any one of the base drives, and supplying voltage to the pulse width modulator, that powers the pulse width modulator and which is discontinued if a fault is detected.

FIG. 5 shows the protection logic circuit. It has a positive voltage source, which supplies current through a resistor 88 to the line 30A, and the line 30B, which is returned to ground in the protection logic. The voltage on that line 30A is supplied to a trigger 90, and the output of that trigger is supplied to an inverter 92. The output from the inverter is supplied to one input on gate 94, the other inputs are connected to other sources of faults in the system. (Those are not identified in this description, for example, the condition of the governor, the safety, or the lighting.) When the current flow through the line 30A is discontinued, because a fault appears in one of the fault detectors, the voltage on the input to the trigger 90 rises, causing a signal to be produced on the output from the gate 94. The output from the gate is supplied to a flip-flop 96, and the change in state of the output from gate 94 resets that flip-flop. The set terminal on that flip-flop 96 is connected to the output from a monostable or a delay 98, and that monostable receives a signal, from the motor control, power-on/power-off. That power-on/power-off signal is actually supplied through an opto-isolator 100, included to isolate the protection logic from the remaining portions of the system for safety and noise reduction purposes, and when the power-on/off signal appears, indicating power on, the monostable 98 goes high, which sets the flip-flop. The output from the isolator 100 is also supplied to gate 102, which, in response to the high signal from the flip-flop and the high signal on the output from the isolator 100, activates the switch 104. That switch connects the positive voltage to supply the PLS voltage—it powers the outputs of the pulse width modulators (See FIG. 3). The output from the monostable 98 stays high for a short interval of time. This delay allows the transistors to be driven. Eventually, the monostable goes to zero and, thus, the set terminal goes back to zero. But, that has no effect on the output from the flip-flop, and so the PLS signal continues to be supplied. But, if when the monostable switches off the reset input is low, the flip-flop will change state, and that will turn off the gate 102, which, in turn, will deactivate the switch 104, terminating the production of the PLS signal. The effect of this type of test is to allow the drives to be operated for a short interval of time, but, if after that interval of time a fault is detected, the PLS signal is discontinued. Obviously, the generation of a fault on any one of the other inputs to the gate 94 will also cause the same result. If a fault is present, it will override the operation of the flip-flop and discontinue the generation of the PLS signal. Thus, the operation of the monostable 98 provides an initial test, just as the motor is being started up or power is being supplied to the pulse width modulator, while the operation associated with the Schmitt trigger 90 and the circuitry between it and the flip-flop reset input 96 are intended to control the operation after that short interval of time in order to detect a fault during normal operation. This two-stage approach is required because, during startup, inconsequential faults may appear to exist, faults that should not cause system shutdown.

Obviously, the invention may be implemented in whole or in part with a computer, e.g. a microprocessor, programmed to carry out the various tests according to the method that is inherent in the operation of the embodiment of the invention that has been described previously. In addition, for one skilled in the art, other modifications, variations and alterations may be possible.

We claim:

1. A system characterized by:
    a motor,
    an inverter, for operating the motor, having one or more output power transistors,
    an inverter control for providing a drive signal to drive each transistor,
    inverter protection means for providing power to a portion of the inverter control and removing said power to turn off said transistor drive in response to a particular transistor operating condition of one of the transistors that occurs during one or more pre-established time intervals while the drive signal is applied;
    said inverter protection means comprising means for removing said power if the time it takes for the transistor collector-emitter voltage to drop to the transistor's saturation voltage after the drive signal is applied exceeds a certain predetermined time interval.

2. A system according to claim 1, characterized in that said inverter protection means comprises means for removing said power if there is a rise above a predetermined level in collector-emitter voltage of the transistor while the drive signal is applied.

3. A system according to claims 1 or 2, characterized in that said inverter protection means comprises means for removing said power if, following a set interval after a motor start signal is applied to the inverter control, the transistor collector-emitter voltage exceeds a limit.

4. A system according to claim 1, further characterized by:
    a carrier signal source,
    a power supply associated with each inverter transistor for providing power, from said carrier signal to drive the transistor,
    a power supply for providing operating power, from said carrier, to said inverter control means and said protection circuit means.

5. A system according to claim 1, characterized by said inverter protection means comprising:
    a series switch system, the continuity of which is broken if that particular transistor operating condition occurs,
    a voltage source for providing current through said switch system,
    means for removing power from the inverter upon sensing a selected change in the current through the switch system.

6. A system according to claim 5, characterized in that said switch system includes, in series, optically controlled transistors, each associated with an inverter output power transistor.

7. A system according to claim 1, characterized in that said inverter protection means comprises:
    gate means associated with each transistor in the inverter for receiving a first signal that is applied to the transistor for driving the transistor in the presence of a second signal that is simultaneously received by said gate means;
    means for sensing the collector-emitter voltage of the transistor for a predetermined time after the first signal is received by said gate means and providing the second signal in response to a change in that voltage, during that time, that is less than the pre-established reference voltages.

8. A system according to claim 7, characterized in that said inverter protection means comprises:
    opto-isolation means for receiving a signal from the inverter control and providing said first signal.

9. A system according to claims 1 or 7, characterized in that said inverter protection means comprises:
    means for providing an inverter power signal to power the inverter in response to a signal provided from the inverter control to start the motor, said means including gate means through which said signal to power the inverter is provided in the presence of a gating signal applied to said gate means, and means for providing said gating signal for a predetermined duration beginning at the application of said inverter power signal and after said duration unless a said particular transistor operating condition occurs.

* * * * *